United States Patent [19]

Yamaguchi et al.

[11] Patent Number: 5,496,632
[45] Date of Patent: Mar. 5, 1996

[54] MAGNETIC RECORDING MEDIUM AND MANUFACTURING METHOD THEREOF

[75] Inventors: Kiyoto Yamaguchi, Zushi; Yukiko Mamiya, Yokosuka; Atsushi Ueda, Zushi; Hiroyuki Uwazumi, Matsumoto, all of Japan

[73] Assignee: Fuji Electric Co., Ltd., Japan

[21] Appl. No.: 181,422

[22] Filed: Jan. 14, 1994

[30] Foreign Application Priority Data

Jan. 20, 1993 [JP] Japan ................. 5-007472

[51] Int. Cl.$^6$ ............ B32B 5/16; B32B 15/00; G11B 5/66
[52] U.S. Cl. .......... 428/332; 428/336; 428/611; 428/615; 428/655; 428/666; 428/667; 428/694 T; 428/694 TS; 428/694 TP; 428/900; 428/928
[58] Field of Search .............. 428/694 T, 694 TS, 428/694 TP, 900, 928, 332, 336, 611, 615, 655, 666, 667

[56] References Cited

U.S. PATENT DOCUMENTS

| | | | |
|---|---|---|---|
| 5,098,733 | 3/1992 | Kyogoku et al. | 426/573 |
| 5,298,324 | 3/1994 | Ivett | 428/336 |
| 5,316,844 | 3/1994 | Suzuki | 428/323 |
| 5,324,593 | 6/1994 | Lal | 428/610 |
| 5,344,706 | 9/1994 | Lambeth | 428/336 |
| 5,352,501 | 10/1994 | Miyamoto | 428/64 |
| 5,372,843 | 12/1994 | Miyamura | 427/130 |

FOREIGN PATENT DOCUMENTS

| | | | |
|---|---|---|---|
| 4008134 | 9/1990 | Germany | G11B 5/716 |
| 3921856 | 1/1991 | Germany | G11B 5/716 |
| 4209744 | 10/1992 | Germany | G11B 5/62 |
| 4328317 | 11/1992 | Japan . | |
| 4-328317 | 11/1992 | Japan . | |
| 1295442 | 3/1987 | U.S.S.R. | G11B 5/66 |
| 1631596 | 2/1991 | U.S.S.R. | G11B 5/66 |
| 2254620 | 10/1992 | United Kingdom | C23C 14/58 |

*Primary Examiner*—Leszek Kiliman
*Attorney, Agent, or Firm*—Parkhurst, Wendel & Rossi

[57] ABSTRACT

A magnetic recording medium capable of making a high-density recording, with improved magnetic characteristics such as coercive force (Hc) and other factors, in which the flatness of the surface of a magnetic recording medium is maintained, and a method for the manufacture thereof are disclosed; by disposing a non-magnetic metal buffer layer 6 between a non-magnetic glass substrate 1 and a non-magnetic metal under layer 2 and keeping a ratio $d_1/d_2$ of the half bandwidth of an X-ray diffraction peak of the metal buffer layer 6 and the metal under layer 2 predetermined values, a large increase in coercive force (Hc) can be obtained; in addition, by controlling the film thickness $\delta$ of the metal buffer layer 6 and the base substance temperature (T) when the metal buffer layer 6 is formed, magnetic characteristics such as squareness (S), coercive force squareness (S*), coercive force difference ($_\Delta$ HC) and coercive force squareness difference ($_\Delta$ S*) can be improved.

6 Claims, 6 Drawing Sheets

MAGNETIC RECORDING MEDIUM AND MANUFACTURING METHOD THEREOF

BACKGROUND OF THE INVENTION

The present invention relates to a magnetic recording medium and a manufacturing method thereof, and more particularly to technology to increase the recording density of a magnetic recording medium by isotropically improving magnetic characteristics such as coercive force and squareness ratio.

DESCRIPTION OF THE PRIOR ART

A fixed magnetic disk device has often been used recently as an external recording device for information processing devices such as computers. FIG. 6 shows such a configuration of the general magnetic recording disk (magnetic recording medium) as used in this fixed magnetic disk device. The magnetic recording disk has a non-magnetic metal under layer 2 laminated on a non-magnetic base substance or substrate 1, and a magnetic layer 3 made of cobalt-chromium-platinum (Co-Cr-Pt) alloy, which is a ferromagnetic alloy, is formed in thin-film form on the metal under layer 2. Furthermore, an amorphous carbon protective layer 4 is formed on this magnetic layer 3. Then, a lubrication layer 5 composed of a liquid lubricant is disposed on the protective layer 4.

A glass-based substance that has been mirror ground, an aluminum plate, and a ceramic plate are used, for example, as the non-magnetic base substance 1. The non-magnetic base substance 1 is heated to 300° C. in a vacuum chamber, and then a non-magnetic metal under layer 2 made of Cr with a film thickness of 100 nm, a magnetic layer 3 made of $Co_{80}Cr_{14}Pt_6$ (Co: 80% by atom, Cr: 14% by atom, Pt: 6% by atom) with a film thickness of 50 nm, and a protective layer 4 made of amorphous carbon with a film thickness of 20 nm are formed sequentially using a sputtering process. A fluorocarbon-based aqueous lubricant is applied to the protective layer 4 to form a lubrication layer 5 with a thickness of 2 nm.

The magnetic recording disk thus manufactured has good mechanical properties such as strength and dimensional accuracy, and therefore presents no problem in practical use. Moreover, its magnetic characteristics are also good, having a coercive force (Hc) of about 1600 Oe, and a product of residual magnetic induction and a magnetic layer thickness, Br.δ, of about 400 G.μm.

The amount and diversity of available information have rapidly increased in recent years. As a result, today's fixed magnetic disk devices must offer higher recording densities and larger capacities in order to meet the requirements of mass information processing. Therefore, to obtain the required higher recording densities and larger capacities, magnetic recording media should offer decreased levitation distances of magnetic heads. A magnetic recording disk with a configuration shown in FIG. 6, which uses a mirror-ground glass substrate as the non-magnetic base substance 1, has a smoother surface, and provides reduced magnetic head levitation, thereby increasing the recording density and capacity of the magnetic recording disk.

However, a magnetic recording disk that uses a glass substrate (or a glass substrate substitute) may cause the crystalline structure (a columnar crystalline structure) in the metal under layer formed on the substrate to become amorphous because such a substrate contains oxygen. This would create a problem in that the crystal orientations of the thin film magnetic layers would not be aligned, which in turn would make it difficult to increase coercive force. Also, because the substrate surface is smooth, the squareness ratio is extremely poor. In the past, it has not been possible to reduce the levitation distances of magnetic heads without causing the magnetic characteristics to be degraded. As a result, there has been a limit to how much the recording density in magnetic recording disks could be increased.

SUMMARY OF THE INVENTION

In the light of the above problem, the present invention is intended to provide a magnetic recording medium that is capable of high-density recording with the magnetic characteristics of high coercive force and high squareness, while maintaining the smooth surface of the magnetic recording medium and the small levitation distance of the magnetic heads, and to establish a manufacturing method thereof.

In order to achieve the above objective, the present magnetic recording medium improves crystal orientation in the metal under layer by forming a non-magnetic buffer layer between the non-magnetic base substance and the metal under layer. This structure aligns the azimuth of the crystal grains in thin-film layer, greatly improves magnetic characteristics such as the coercive force (Hc) and the squareness (S), and creates a magnetic recording medium capable of high-density recording. That is, the magnetic recording medium is characterized in that it has a non-magnetic metal buffer layer made of Cr formed on the surface of the non-magnetic base substance, a non-magnetic metal under layer made of Cr formed on said metal buffer layer, a thin-film magnetic layer made of a ferromagnetic alloy formed on said metal under layer, and a protective layer formed on the surface of said thin film magnetic layer, wherein $d_1/d_2$ is 1.2 or more, preferably 1.5 or more where $d_1$ is a half bandwidth of an X-ray diffraction peak on the (110) plane of the metal buffer layer and $d_2$ is a half bandwidth of an X-ray diffraction peak on the (110) plane of the metal under layer.

In this magnetic recording medium, the thickness of the metal buffer layer should be within a range of 30 nm to 200 nm, and preferably within a range of 50 nm to 150 nm.

The method to manufacture this magnetic recording medium is characterized in that it has a metal buffer layer forming process to form a metal buffer layer when the non-magnetic base substance is heated to a temperature ranging from 50° C. to 200° C.

With the present magnetic recording medium, it is possible to greatly improve magnetic characteristics such as the coercive force (Hc) and the squareness (S) by forming a non-magnetic metal buffer layer between the non-magnetic base substance and the metal under layer, and controlling the ratio $d_1/d_2$ of the half bandwidth $d_1$ of the X-ray diffraction peak on the (110) plane of the metal buffer layer growing parallel to the substrate face (on the surface of the metal buffer layer) to the half bandwidth $d_2$ of the X-ray diffraction peak on the (110) plane of the metal under layer (on the surface of the metal under layer). In other words, because columnar crystals grow in the metal under layer and crystalline orientation is improved by disposing a metal buffer layer between the non-magnetic base substance and the metal under layer, the azimuth of crystal grains in a thin-film magnetic layer formed on the metal under layer is aligned and the magnetic characteristics are greatly improved, which makes it possible to increase the coercive force (Hc). In particular, if the magnetic recording medium is manufactured by forming a metal buffer layer and a metal under layer in which $d_1/d_2$ is 1.2 or higher, the coercive force (Hc) can be increased by 200 Oe or more as compared with conventional recording media that does not have a metal buffer layer. If the magnetic recording medium is manufactured so that $d_1/d_2$ is 1.5 or higher, the increase in the coercive force (Hc) becomes even greater, about 500 Oe or more. As described, because this magnetic recording medium uses a glass substrate with high surface flatness as the non-magnetic base substance, which improves magnetic characteristics by, for example, increasing the coercive force (Hc) while maintaining the small levitation distance of the magnetic head, a magnetic recording medium with a high recording density and large capacity can be created.

If a magnetic recording medium is manufactured with the film thickness of the metal buffer layer controlled within a range of 30 nm to 200 nm, or more preferably within a range of 50 nm to 150 nm, the coercive force squareness (S*) can be enhanced while the coercive force (Hc) is kept high. Since this improves the coercive force squareness (S*) as well as the squareness (S), the magnetic characteristics are further improved, and a magnetic recording medium with a higher recording density can be realized.

In addition, by manufacturing a magnetic recording medium with the metal buffer layer formed by heating the non-magnetic base substance within a range of 50° C. to 200° C., the coercive force difference ($_\Delta$ Hc) and the coercive squareness differences ($_\Delta$ S*) can be reduced. The coercive force difference ($_\Delta$ Hc) and the coercive squareness difference ($_\Delta$ S*) can be used as references for the difference between the characteristics in the circumferential direction (the coercive force difference ($_\Delta$ Hc), the coercive squareness difference ($_\Delta$ S*) and the characteristics in the radial direction. Therefore, by reducing the coercive force difference ($_\Delta$ Hc) and the coercive squareness difference ($_\Delta$ S*), it is possible to improve the magnetic characteristics isotropically. Because this can in turn reduce bit lengths and track widths, a high recording density medium with a high information recording density can be realized.

DESCRIPTION OF THE PREFERRED EMBODIMENT

The preferred embodiment of this magnetic recording medium is explained below with reference to the appended drawings.

Figure 1:
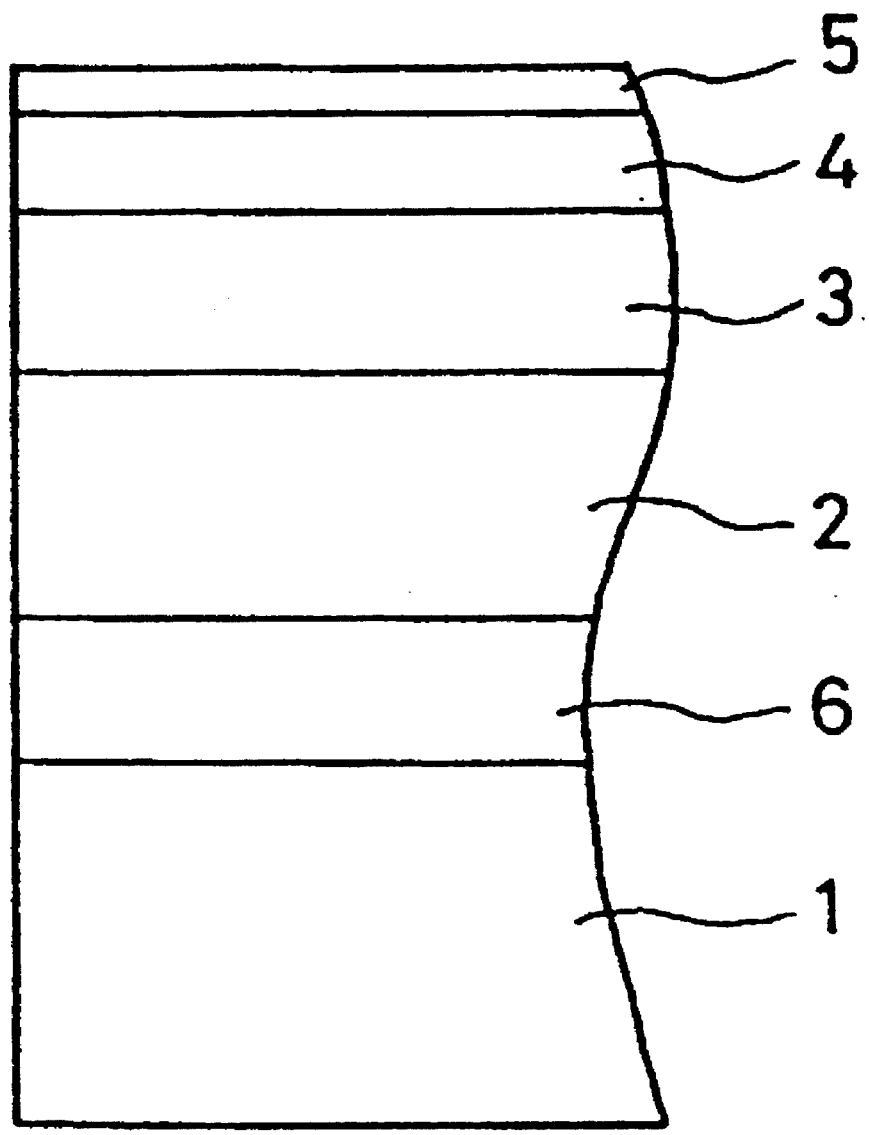
FIG. 1 shows a cross section of a magnetic recording disk (a magnetic recording medium) according to one embodiment of the present invention.
Figure 6:
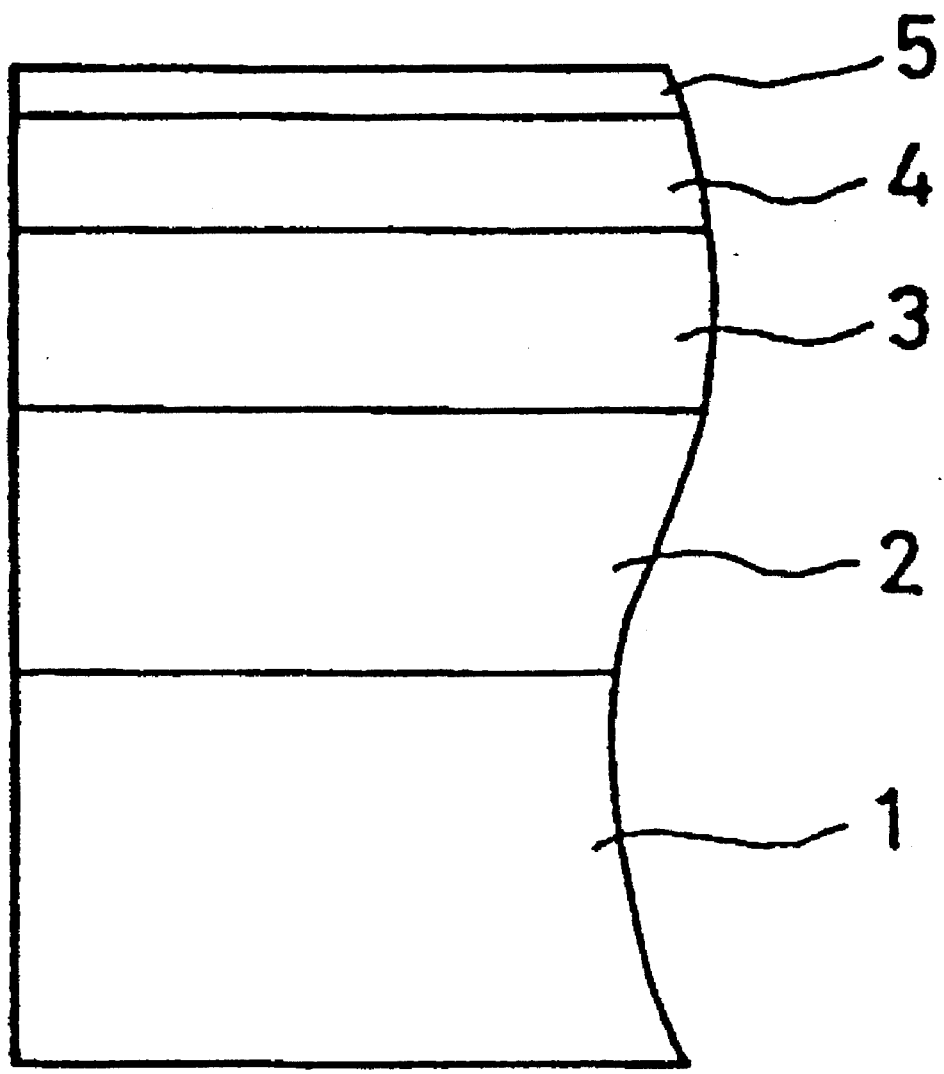
FIG. 6 shows a cross section of a conventional magnetic recording disk.

FIG. 1 is a cross section drawing showing the configuration of this magnetic recording disk (a magnetic recording medium). Since this magnetic recording disk, which is shown in FIG. 1, has nearly the same configuration as for the conventional magnetic recording disk that was explained earlier with reference to FIG. 6, the parts corresponding to parts in FIG. 6 are given the same numerals as those parts.

In FIG. 1, the magnetic recording disk of this embodiment uses a glass substrate 1 as a non-magnetic base substance, upon which a non-magnetic metal buffer layer 6 made of Cr is formed and upon which a non-magnetic metal under layer 2 also made of Cr is laminated. On the metal under layer 2, a magnetic layer 3 made of $Co_{80}Cr_{14}Pt_6$ (Co at 80% by atom, Cr at 14% by atom, and Pt at 6% by atom), which is a ferromagnetic alloy, is formed as a thin film, while on the magnetic layer 3, an amorphous carbon protective layer 4 is formed. Moreover, on the protective layer 4, a lubrication layer 5 made of an aqueous lubricant is formed, thus making up the structure of the magnetic recording disk according to the present invention. The magnetic recording disk with the above configuration is characterized in that a non-magnetic metal buffer layer 6 is disposed between the glass substrate 1 and the metal under layer 2.

In this magnetic recording disk, the surface of the disk-shaped glass substrate 1, which inner and outer diameter processing and fact cutting have been applied, is first subject to ultra-precision flat grinding to a mirror surface with an average centerline roughness, Ra, between 0.5 nm and 1.5 nm. This glass substrate 1 is given a precision rinsing, set in a holder, and is then sent to a charging chamber in the magnetron-sputtering equipment of the in-line system. This charging chamber is evacuated to a vacuum of $7\times10^{-4}$ Pa or lower, and the glass substrate 1 is heated to a predetermined temperature of T° C. Then, the holder including the glass substrate 1 is transported to a film forming chamber "A", which has an interior consisting of argon gas at a pressure of 0.7 Pa, and a non-magnetic metal buffer layer 6 made of Cr is formed by sputtering on the glass substrate 1 to a predetermined thickness of δ nm. Next, after the holder including the glass substrate 1 formed with a metal buffer layer 6 has been transported to the film forming chamber "B" where the glass substrate 1 is heated to 300° C., and a sputtering process is used to sequentially create a non-magnetic metal under layer 2 made of Cr with thickness of 100 nm, a magnetic layer 3 made of $Co_{80}Cr_{14}Pt_6$ alloy with a thickness of 50 nm, and a protective layer 4 made of amorphous carbon with a thickness of 20 nm, while applying −200 V DC bias to the glass substrate 1. Subsequently, the holder is transported to a removing chamber, which has an internal pressure of one atmosphere, and then the glass substrate 1 made up of the aforementioned layers is removed from the holder. Then, a fluorocarbon-based aqueous lubricant is coated on the surface of the protective layer 4 to form a lubrication layer 5 with a thickness of 2 nm, thus allowing the magnetic recording disk to be completed.

Figure 2:
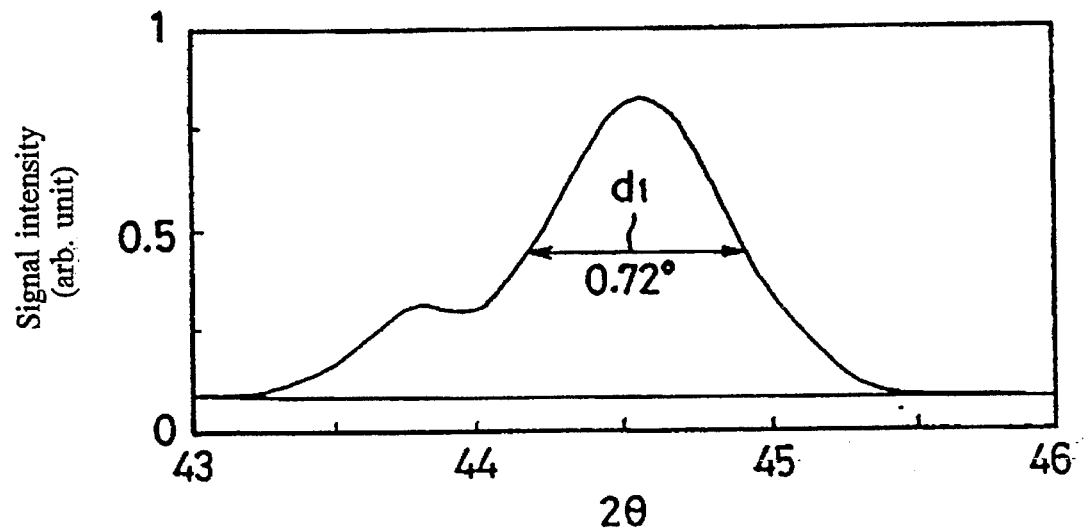
FIG. 2(a) consists of a graph showing the results of observing a metal buffer layer in said magnetic recording disk by using X-ray diffraction, and FIG. 2(b) consists of a graph showing the results of observing a metal under layer by using X-ray diffraction.
Figure 2:
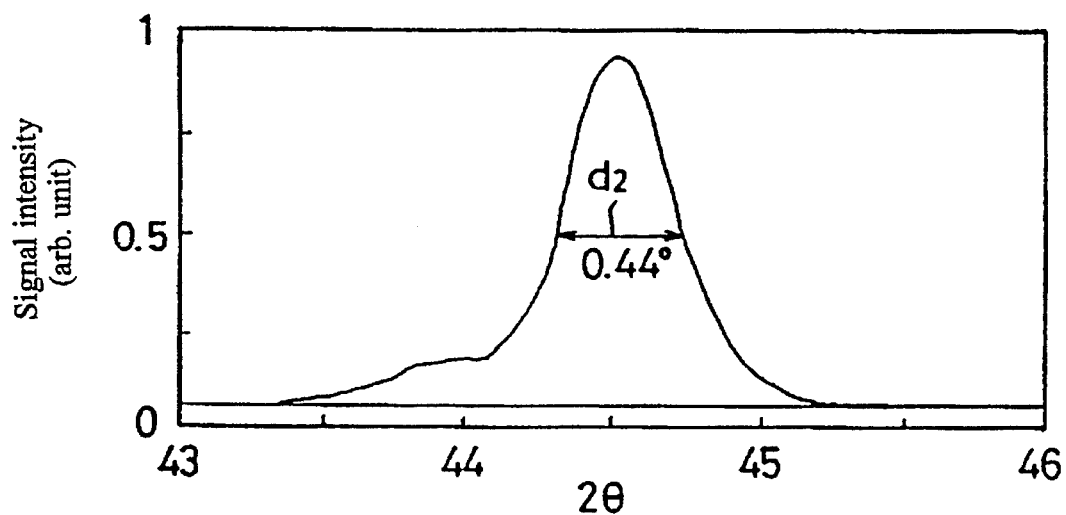

FIGS. 2(a) and (b) show the results of observing the surface of the above-described magnetic recording disk, using a thin film X-ray diffraction method. FIG. 2(a) is the result of an X-ray diffraction conducted on the (110) plane of the metal buffer layer 6 (on the surface of the metal buffer layer 6) at the stage in which the metal buffer layer 6 is formed on the glass substrate 1. FIG. 2 (b) is the result of an X-ray diffraction conducted on the (110) plane of the metal under layer 2 (on the surface of the metal under layer 2) at the stage in which the metal under layer 2 is formed on the metal buffer layer 6. In the FIGS. 2(a) and (b), the half bandwidth in the X-ray diffraction peak on the (110) plane of the metal buffer layer 6 (a width at a position halfway along the peak height), $d_1$, is 0.72°, which indicates that the crystal structure has become more amorphous. The half bandwidth in the X-ray diffraction peak on the (110) plane of the metal under layer 2, $d_2$, is 0.44°, which indicates that the crystalline orientation has improved as a result of the growth of columnar crystals. This means that a metal buffer layer 6 with increased amorphousness is formed when the columnar structure in Cr collapses because oxygen is incorporated into the film to control the substrate temperature "T" when the metal buffer layer 6 is formed at a temperature that is lower than the substrate temperature (300° C.) when the metal under layer 2 is formed (the substrate temperature "T" will be described in detail in the latter part of this document). The above improvement is believed to be brought about by the stabilization of crystal structure in the metal under layer 2 resulting from the metal buffer layer 6, which causes columnar crystals to grow and improve the crystalline orientation.

Figure 3:
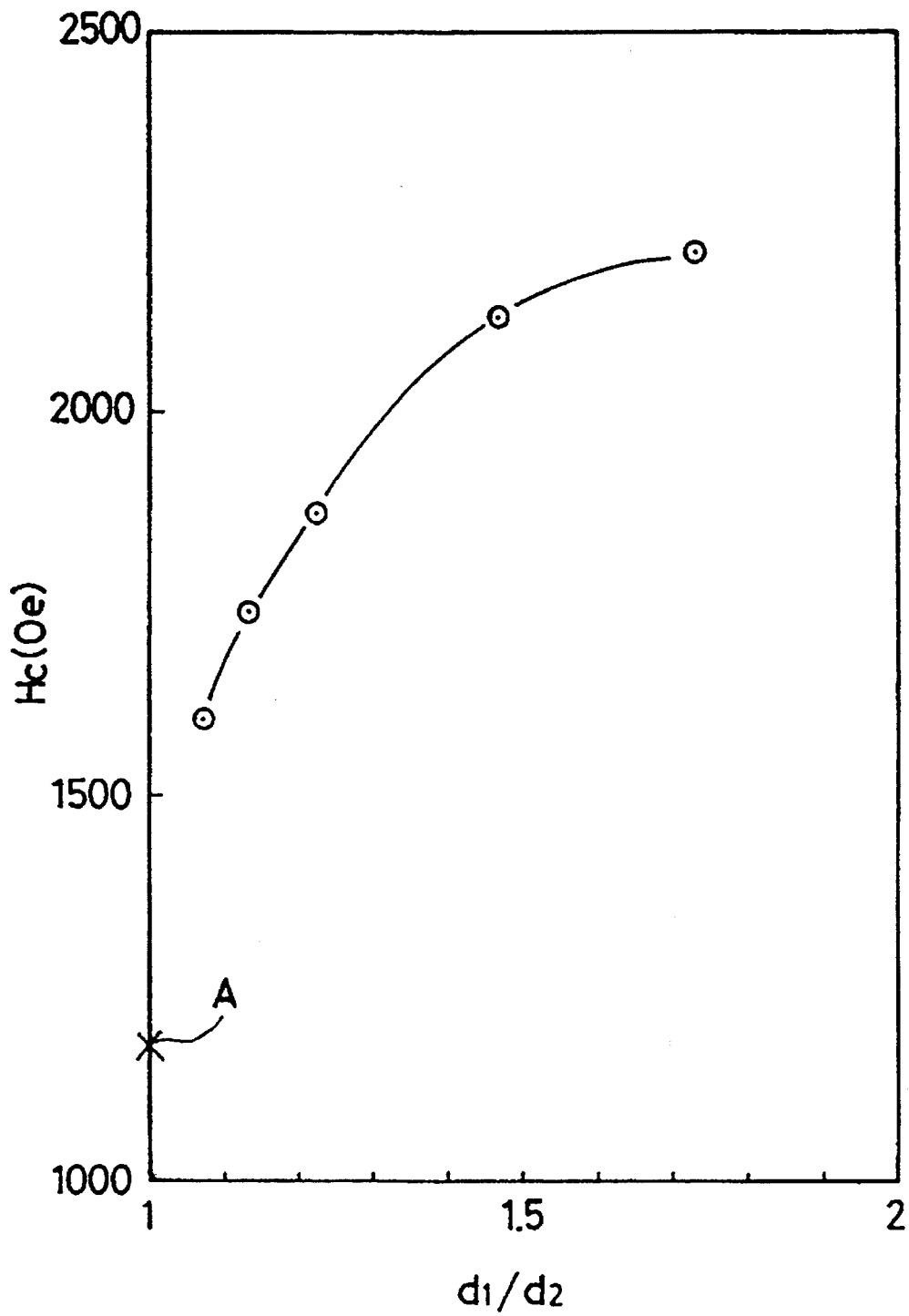
FIG. 3 is a graph showing the relationship between the ratio $d_1/d_2$ of a half bandwidth $d_1$ in the X-ray diffraction of the metal under layer to a half bandwidth $d_2$ in the X-ray diffraction of the metal buffer layer, and the coercive force (Hc) in said magnetic recording disk.

FIG. 3 is a graph showing the relationship between the ratio $d_1/d_2$ of the half bandwidth $d_1$ in the X-ray diffraction of the metal under layer to a half bandwidth $d_1$ in the X-ray diffraction of the metal buffer layer and coercive force (Hc). In FIG. 3, the coercive force (Hc) shows an increasing trend as the $d_1/d_2$ increases. The range of increase of the coercive force (Hc) ($_\Delta$ Hc) is more than 200 Oe when $d_1/d_2 \geq 1.2$. Meanwhile, when $d_1/d_2 \geq 1.5$, the increase range is more than 500 Oe. Thus, by forming a metal buffer layer 6 between the glass substrate 1 and the metal under layer 2, the crystalline orientation in the metal under layer 2 can be improved. As a result, the crystal azimuth in the magnetic layer 3 formed on the metal under layer 2 improves, thereby improving the magnetic characteristics, and enhancing the coercive force (Hc). The operation of $d_1/d_2$, which greatly improves the coercive force (Hc), is done by controlling the substrate temperature "T" when the metal buffer layer 6 is formed, or by forming the metal buffer layer 6 using a mixed sputtering gas including oxygen and carbon, which can make the crystal structure of the metal buffer layer 6 amorphous. Incidentally, in FIG. 3, point "A" shows the coercive force (Hc) of a conventional magnetic recording disk that does not have a metal buffer layer 6, and the coercive force is approximately 1200 Oe. Contrary to this, the coercive force (Hc) of this magnetic recording disk is between approximately 1550 Oe and 2200 Oe, which means that the coercive force (Hc) is greatly improved by the presence of the metal buffer layer 6.

Figure 4:
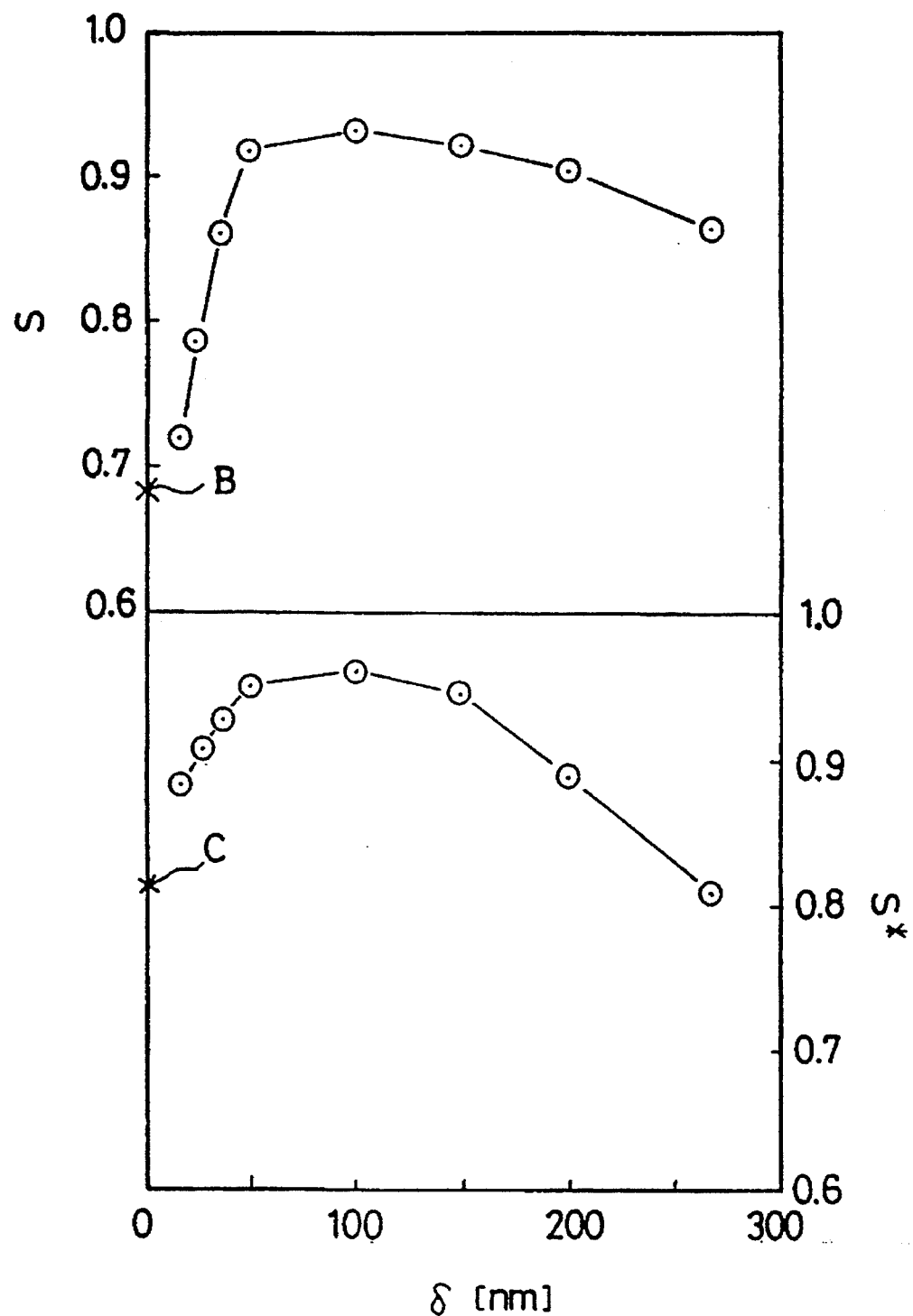
FIG. 4 is a graph showing the relationship of film thickness $\delta$ in the metal buffer layer and squareness (S) and coercive force squareness (S*) in said magnetic recording disk.

FIG. 4 is a graph showing the relationship of the film thickness δ in the metal buffer layer 6 to the squareness (S) and coercive force squareness (S*). FIG. 4 also shows as a comparative sample squareness (point B) and coercive force squareness (S*) (point C). The values are about 0.7 (0.685) for the squareness (S) and about 0.82 (0.815) for the coercive force squareness (S*). Both the squareness (S) and the coercive force squareness (S*) show an increasing trend as the film thickness δ increases. However, this trend is reversed when a certain threshold value is exceeded (a film thickness δ of about 100 nm for both of the squareness (S) and coercive force squareness (S*). To make both of the squareness (S) and the coercive force squareness (S*) higher than 0.85 (S, S* ≥0.85), it is necessary to set the film thickness δ of the metal buffer layer 6 to 30 nm≤δ≤200 nm. Furthermore, to make both the squareness (S) and the coercive force squareness (S*) higher than 0.90 (S, S≥0.90), it is necessary to set the film thickness δ of the metal buffer layer 6 to 50 nm≤δ≤150 nm. Thus, this magnetic recording disk, which includes a metal buffer layer 6, has a higher squareness (S) and coercive force squareness (S*) than do conventional magnetic recording disks, and moreover, by controlling the film thickness δ of the metal buffer layer 6, the squareness (S) and the coercive force squareness (S*), which are important elements in ensuring a higher recording density in a magnetic recording medium, can be greatly improved.

Figure 5:
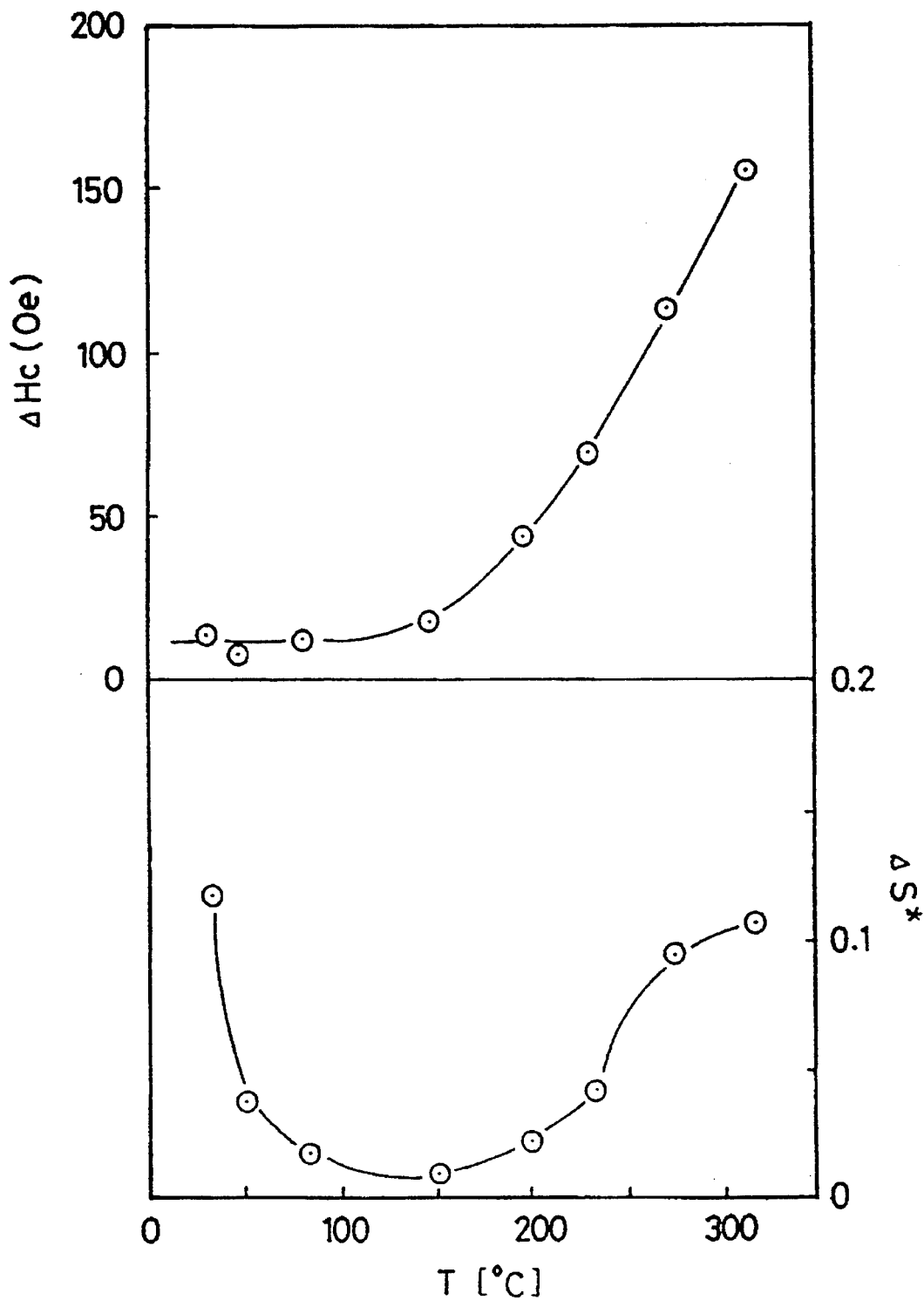
FIG. 5 is a graph showing the relationship of temperature (T) in a non-magnetic base substance and the coercive force difference ($_\Delta$ Hc) and coercive force squareness difference ($_\Delta$ S*) in said magnetic recording disk.

FIG. 5 is a graph showing the relationship between the temperature (T) in a glass substrate 1 when the metal buffer layer 6 is formed, and the coercive force difference ($_\Delta$ Hc) and coercive force squareness difference ($_\Delta$ S*). The coercive force difference ($_\Delta$ Hc) refers to the difference between the coercive force Hc (P), which is the force created when the impressed direction of the external magnetic field for measuring the magnetic characteristics is parallel to the substrate carrier direction for manufacturing the magnetic recording disk, and the coercive force Hc (V), which is the force created when the said impressed direction is vertical to the said substrate carrier direction. The coercive force squareness difference ($_\Delta$ S*) refers, as does the above coercive force difference ($_\Delta$ Hc), to the difference between the coercive force squareness S* (P), which is the squareness created when the impressed direction of the external magnetic field for measuring the magnetic characteristics is parallel to the substrate carrier direction for manufacturing the magnetic recording disk, and the coercive force squareness S* (V), which is the squareness created when the said impressed direction is vertical to the said substrate carrier direction. That is, the coercive force difference ($_\Delta$ Hc) and the coercive force squareness difference ($_\Delta$ S*) may be used as references for the difference between the characteristics of a magnetic recording disk in its circumferential direction, and those in the radial direction, as well as an index to show that the magnetic characteristics have been isotropically obtained on the surface of a magnetic recording disk. In the figure, while the coercive force difference ($_\Delta$ Hc) increases monotonously as the temperature (T) (°C.) in the glass substrate 1 increases, the coercive force squareness difference ($_\Delta$ S*) takes on a minimum value in a certain temperature range (temperature (T) at about 150° C.), and thereafter tends to increase.

For a magnetic recording disk to achieve a high density recording, it is preferable that both of the coercive force difference ($_\Delta$ Hc) and the coercive force squareness difference ($_\Delta$ S*) be small, whereas to meet such a requirement in this magnetic recording disk, it is necessary to set the temperature (T) on the glass substrate 1 within a range of 50° C.≤T≤200° C. This allows the coercive force difference ($_\Delta$ Hc) to be ≤50 Oe and the coercive force squareness difference ($_\Delta$ S*)≤0.05, which makes it possible to increase the recording density for the magnetic recording disk.

As described above, this magnetic recording disk is characterized in that a non-magnetic metal buffer layer 6 is disposed between the glass substrate 1 and the metal under layer 2. In addition, by controlling the ratio $d_1/d_2$ of half bandwidth in an X-ray diffraction peak ($d_1$=half bandwidth of the metal buffer layer 6, and $d_2$=half bandwidth of the metal under layer 2) on the (110) planes on the metal buffer layer 6 and the metal under layer 2, both of which are made of Cr, to more than 1.2, or more preferably more than 1.5, the coercive force (Hc) can be greatly increased. Furthermore, by forming the metal buffer layer 6 while the film thickness δ of the metal buffer layer 6 is controlled within a range of 30 nm to 200 nm, and the temperature (T) in the glass substrate 1 is controlled within a range of 50° C. to 200° C. during the manufacture of the magnetic recording disk, the coercive force (Hc) can be increased isotropically within the film planes. Moreover, the squareness (S) and the coercive force squareness (S*) can also be enhanced. Moreover, especially when the film thickness is within a range from 50 nm to 100 nm, the squareness (S) and the coercive force squareness (S*) can be made higher than 0.90. Therefore, in this magnetic recording disk, such magnetic characteristics as the coercive force (Hc), squareness (S) and the coercive force squareness (S) can also be enhanced, and furthermore, because the improvement can be isotropically, it is possible to contract the bit length and narrow the track width simultaneously, thereby making it possible to structure a high-density recording medium. Because the substrate 1 has excellent surface flatness and is used as a non-magnetic base substance in this magnetic recording disk, the levitation of the magnetic head is kept low, which is preferable for obtaining a higher recording density in the magnetic recording disk.

Meanwhile, in this embodiment, both the metal buffer layer 6 and the metal under layer 2 were formed using chromium. Instead of chromium, it is also possible to use a chromium compound to which a second component is added, which makes the crystal structure amorphous, since the metal buffer layer 6 improves the crystalline orientation. At the same time, a glass substrate 1 was used as a non-magnetic base substance, although this material need not be limited to glass, but rather may be ceramic plate, aluminum plate, titanium plate, carbon plate, or silicon plate.

What is claimed is:

1. A magnetic recording medium comprising:

a non-magnetic base substrate;

a non-magnetic metal buffer layer formed on said non-magnetic base substrate, said non-magnetic buffer layer comprising Cr;

a non-magnetic metal under layer formed on said metal buffer layer, said non-magnetic under layer comprising Cr;

a thin-film magnetic layer comprised of a ferromagnetic alloy formed on said metal under layer; and a protective layer formed on the surface of said thin-film magnetic layer;

wherein $d_1/d_2$ is not less than 1.2 where $d_1$ is a half bandwidth of an X-ray diffraction peak on the (110) plane of the metal buffer layer, and $d_2$ is a half bandwidth of an X-ray diffraction peak on the (110) plane of the metal under layer.

2. A magnetic recording medium as claimed in claim 1, wherein $d_1/d_2$ is not less than 1.5.

3. A magnetic recording medium as claimed in claim 1, wherein the thickness of the metal buffer layer is within a range of 30 nm to 200 nm.

4. A magnetic recording medium as claimed in claim 2, wherein the thickness of the metal buffer layer is within a range of 30 nm to 200 nm.

5. A magnetic recording medium as claimed in claim 3, wherein the thickness of the metal buffer layer is within a range of 50 nm to 150 nm.

6. A magnetic recording medium as claimed in claim 4, wherein the thickness of the metal buffer layer is within a range of 50 nm to 150 nm.

* * * * *